US007231623B2

(12) United States Patent  (10) Patent No.: US 7,231,623 B2
Miller  (45) Date of Patent: Jun. 12, 2007

(54) NETLIST DATABASE

(75) Inventor: Eric Miller, Fort Collins, CO (US)

(73) Assignee: LSI Corporation, Milpitas, CA (US)

( * ) Notice: Subject to any disclaimer, the term of this patent is extended or adjusted under 35 U.S.C. 154(b) by 258 days.

(21) Appl. No.: 10/956,862

(22) Filed: Sep. 30, 2004

(65) Prior Publication Data

US 2006/0074938 A1   Apr. 6, 2006

(51) Int. Cl.
*G06F 17/50* (2006.01)

(52) U.S. Cl. .................................. 716/11; 716/1; 716/4
(58) Field of Classification Search ..................... None
See application file for complete search history.

(56) References Cited

U.S. PATENT DOCUMENTS

| | | | | | |
|---|---|---|---|---|---|
| 5,463,563 | A | * | 10/1995 | Bair et al. ..................... | 716/11 |
| 5,493,508 | A | * | 2/1996 | Dangelo et al. ................ | 716/5 |
| 5,856,925 | A | * | 1/1999 | Maeda et al. ................... | 716/5 |
| 6,910,200 | B1 | * | 6/2005 | Aubel et al. .................... | 716/9 |

* cited by examiner

*Primary Examiner*—Leigh M. Garbowski
(74) *Attorney, Agent, or Firm*—Cochran, Freund & Young

(57) ABSTRACT

Disclosed is an object oriented netlist database that stores electrical circuit data parsed from a netlist text file that is formatted in HSPICE or Circuit Design Language (CDL) formats. To obtain the netlist text file, an electrical circuit schematic of an electrical circuit is created using a commercially available electrical schematic capture software tool. The electrical schematic capture software tool is then directed to create the netlist text file that is representative of the electrical circuit. A netlist text file parser program first creates the object oriented netlist database structure, then parses the netlist text file, and finally fills the netlist database with objects that represent the electrical circuit data contained in the netlist text file. Analysis software may be written to programmatically access the electrical data stored in the netlist database using netlist database access subroutines that are part of the netlist database objects. The analysis software may be used to locate topological circuit problems within the electrical circuit represented by the electrical circuit data. The analysis software may be run against the electrical circuit prior to laying out the electrical circuit for manufacture as an integrated circuit. This means topological circuit problems associated with manufacturing the electrical circuit as an integrated circuit may be found before time is taken to lay out, or manufacture, the electrical circuit as an integrated circuit.

50 Claims, 7 Drawing Sheets

600 FLATTENED NDB TABLES, OBJECT FIELDS & RELATIONS

NETLIST DATABASE

BACKGROUND OF THE INVENTION a. Field of the Invention

The present invention pertains generally to integrated circuit design and manufacturing, and more specifically to software and database techniques that aid in analyzing an electrical circuit that is intended to be manufactured as an integrated circuit.

b. Description of the Background

The process of creating an integrated circuit begins by first designing an electrical schematic of an electrical circuit that will someday be created as an integrated circuit. Until the electrical circuit schematic is designed, the layout of the integrated circuit cannot begin. To make circuit design more efficient and less prone to error, software tools have been created to assist in creating the electrical circuit schematic drawing. The software tool, commonly called electrical schematic capture software, allows an electrical circuit designer to create an electrical circuit schematic in much the same manner as computer aided design (CAD) software tools assist a mechanical draftsperson in creating a mechanical drawing of a physical device. Some of the most common electrical schematic capture software tool vendors include: Mentor Graphics Corporation, Cadence Design Systems, and Synopsys, Inc. Many of the electrical schematic capture software tool vendors also supply electrical circuit analysis and simulation software tools, and integrated circuit layout and testing software tools. Mentor Graphics Corporation is located at 8005 SW Boeckman Road, Wilsonville, Oreg. 97070, and may be contacted at phone numbers 800-592-2210 and 503-685-7000 Cadence Design Systems is located at 2655 Seely Avenue, San Jose, Calif. 95134, and may be contacted at phone number 408-943-1234 Synopsys, Inc. is located at 700 East Middlefield Road, Mountain View, Calif. 94043, and may be contacted at phone numbers 650-584-5000 and 800-541-7737.

The electrical circuit designer typically lays out an electrical circuit schematic by placing primitive electrical devices onto an electrical schematic page. The electrical circuit designer then connects the primitive electrical devices with a line in a manner that creates the desired electrical circuit. The line represents an electrically connecting wire, or an electrical short, between the connected primitive electrical devices. A primitive electrical device is a basic electrical device that cannot be broken down into smaller devices within the electrical schematic capture software. The primitive electrical device is typically a device such as a resistor, capacitor, inductor, diode, transistor, and other similar basic electrical devices. The attributes, or properties, of each primitive electrical device are specified by the electrical circuit designer, and stored within the electrical schematic capture software. The device attributes determine the type and characteristics of each primitive electrical device within the system. For instance, a resistor might have attributes to define resistance, power ratings, and electrical connection points. Other primitive electrical devices would have similar, appropriate attributes to define the electrical characteristics for the primitive electrical device.

Many times, an electrical circuit designer may want to reuse a part of a circuit, sometimes called a sub-circuit, in other sections of the overall circuit. This is accomplished within the electrical schematic software tool by defining a sub-circuit as a macro. The macro has macro attributes similar to the primitive electrical device that define the external electrical connection points for the macro. The makeup of the internal electrical devices determine the electrical behavior of the macro. A macro can be made up of other macros defined within the electrical schematic capture software tool, as well as primitive electrical devices.

After the electrical circuit schematic is completed, the electrical circuit represented by the electrical circuit schematic is simulated to insure the electrical circuit functions as desired by the circuit designer. The simulation of the electrical circuit may be performed by the electrical schematic capture software tool, or by another analysis software tool. The choice of using the electrical schematic capture software tool simulation or an external simulation software tool depends on the complexity of the electrical circuit, and the complexity of the desired simulation. In order to allow an external software tool to analyze the electrical circuit, the electrical schematic software tool has the ability to create a netlist text file representing the electrical circuit in a text form. The netlist text file contains all of the data defining the primitive electrical devices, the electrical attributes of each primitive electrical device, the sub-circuit macros, the electrical attributes of each macro, the electrical connections for all of the primitive electrical devices and macros, and the attributes of each electrical connection including the connection point of each primitive electrical device and macro included in each electrical connection. HSPICE and Circuit Design Language (CDL) are considered two of the most common netlist text file formats, even though there are other netlist text file formats available. HSPICE is the most common netlist text file format, and is considered a defacto industry standard. HSPICE is a registered trademark of Synopsys, Inc., and information concerning the HSPICE netlist text file format may be obtained by contacting Synopsys, Inc. using the previously stated Synopsys, Inc. contact information. Circuit Design Language (CDL) netlist text file format is controlled by Cadence Design Systems, and information concerning the Circuit Design Language (CDL) netlist text file format may be obtained by contacting Cadence Design Systems using the previously stated Cadence Design Systems contact information. Another netlist text file format is SPECTRE for use with SPECTRE software produced by Cadence Design Systems. SPECTRE is a registered trademark of Cadence Design Systems, Inc., and information concerning the SPECTRE netlist text file format may be obtained by contacting Cadence Design Systems using the previously stated Cadence Design Systems contact information.

The netlist text file is imported by the external analysis software, and the electrical circuit is simulated. If errors in the electrical circuit are found, changes are made to the electrical circuit schematic in the electrical schematic software package. The netlist text file for the updated electrical circuit schematic is created and imported into the analysis software. The simulation and circuit schematic modification is repeated until the electrical circuit functions as desired on the simulator. Many of the analysis software tools allow the user to make modifications to the circuit being simulated so that the analysis process is not too cumbersome.

Once the electrical circuit functions properly within the simulator, the electrical circuit must then be created as an integrated circuit. The same netlist text file used to send electrical circuit data to external analysis and simulation software tools is used to export electrical circuit data to an integrated circuit layout software tool. The integrated circuit layout software tool imports the electrical circuit data in the netlist text file, and uses the electrical circuit data to layout the physical features of the integrated circuit that create the desired electrical circuit. After the integrated circuit layout is performed additional analysis and simulation of the integrated circuit is performed. The analysis and simulation of the integrated circuit allows the circuit designer to perform topological checks of the integrated circuit to find parasitics within the integrated circuit layout. A topological check may be configured to look for layout guidelines, known as Design Rule Checks (DRC's). For example, a topological check may look for a circuit element that has two MOSFET transistors connected together from the drain of one transistor to the gate of the other transistor, and where the source of each transistor is connected to a different ground plain. Since the ground plains may be at different electrical potentials there is a parasitic effect between the two transistors that may cause problems in the function of the circuit that would not be present in a simulation of the electrical circuit that does not include the physical integrated circuit layout. If problems are found during the analysis and simulation of the integrated circuit layout, the circuit changes are made using the electrical schematic capture software tool and the integrated circuit layout is performed again.

After a satisfactory analysis and simulation is performed on the integrated circuit layout, the integrated circuit is created and electrically tested for proper operation. If a problem is encountered, the electrical circuit schematic must be updated within the electrical schematic software tool, and the testing, simulation, layout, and manufacturing of the integrated circuit must be performed again to insure a properly functioning integrated circuit.

The present application is filed simultaneously with application Ser. No. 10/956,860, entitled "Netlist Query Language" by the present inventor, Eric Miller, filed Sep. 30, 2004, the full text of which is hereby specifically incorporated by reference for all it discloses and teaches.

SUMMARY OF THE INVENTION

The present invention overcomes the disadvantages and limitations of the prior art by providing an object oriented netlist database that stores electrical circuit data representative of an electrical circuit. An electrical circuit schematic of the electrical circuit is created in a commercially available electrical schematic software tool. The electrical schematic capture software tool provides some circuit analysis features, but if additional analysis is desired it must be performed on a netlist text file produced by the electrical schematic capture software. Performing analysis on data stored in a text file may be difficult, and very time consuming. Placing the electrical circuit data parsed from the netlist text file into an object oriented database allows more sophisticated programmatic analysis of the electrical circuit data. Analysis software may be written to search the netlist database to locate topological circuit problems associated with manufacturing the electrical circuit as an integrated circuit. The topological circuit problems typically cannot be located until the electrical circuit is laid out for manufacture as an integrated circuit using analysis tools that are part of an integrated circuit layout software tool. Sometimes, the topological circuit problem is not located until the integrated circuit is manufactured and tested. A great deal of time may be saved by avoiding unnecessary integrated circuit re-layout and manufacture to correct the topological circuit problems that may be found using the analysis software to search the netlist database for the topological circuit problems before the electrical circuit is laid out for manufacture as an integrated circuit.

An embodiment of the present invention may therefore comprise a netlist database that is capable of being queried to determine characteristics of data stored in the netlist database comprising: parsed netlist data that has been parsed from a netlist text file that is representative of an electrical circuit, the netlist text file being created by an electrical schematic capture software tool, the electrical schematic capture software tool deriving the netlist text file from an electrical circuit schematic representative of the electrical circuit, and the parsed netlist data being representative of device data, device attribute data, macro data, macro attribute data, connection data, and connection attribute data of the electrical circuit; an object oriented database structure that stores the parsed netlist data comprising objects and object holding tables logically organized to represent the device data, the device attribute data, the macro data, the macro attribute data, the connection data, and the connection attribute data contained in the parsed netlist data; and netlist database access subroutines that permit an external software program to read and update the parsed netlist data contained in the netlist database.

An embodiment of the present invention may further comprise a netlist text file parser program that creates and fills in a netlist database comprising: an input for accepting a netlist text file for processing by the netlist text file parser program, the netlist text file being representative of an electrical circuit, and the netlist text file being created by an electrical schematic capture software tool, the electrical schematic capture software tool deriving the netlist text file from an electrical circuit schematic representing the electrical circuit; a parsing algorithm that parses the netlist text file to obtain parsed netlist data, the parsed netlist data being representative of device data, device attribute data, macro data, macro attribute data, connection data, and connection attribute data of the electrical circuit; a netlist database creation algorithm that creates a netlist database, the netlist database comprising: an object oriented database structure that stores the parsed netlist data comprising objects and object holding tables logically organized to represent the device data, the device attribute data, the macro data, the macro attribute data, the connection data, and the connection attribute data contained in the parsed netlist data; and netlist database access subroutines that permit an external software program to read and update the parsed netlist data contained in the netlist database; and a netlist database loading algorithm that creates object instances and places the object instances into the object holding tables so as to represent the electrical circuit as the electrical circuit is described by the parsed netlist data.

An embodiment of the present invention may further comprise a method of creating a netlist database comprising the steps of: designing an electrical circuit by creating an electrical circuit schematic that is representative of the electrical circuit, the electrical circuit schematic being created with an electrical schematic capture software tool; creating a netlist text file representation of the electrical circuit by exporting the netlist text file from the electrical schematic capture software tool; parsing the netlist text file extracting parsed netlist data, the parsed netlist data being representative of device data, device attribute data, macro data, macro attribute data, connection data, and connection attribute data of the electrical circuit; creating a netlist database, the netlist database comprising: an object oriented database structure that stores the parsed netlist data comprising objects and object holding tables logically organized to represent the device data, the device attribute data, the macro data, the macro attribute data, the connection data, and the connection attribute data contained in the parsed netlist data; and netlist database access subroutines that permit an external software program to read and update the parsed netlist data contained in the netlist database; and placing the parsed netlist data into the netlist database so as to represent the electrical circuit as the electrical circuit is described by the parsed netlist data.

DETAILED DESCRIPTION OF THE INVENTION

The typical rule in all design operations is that the earlier in the design process that an error is found, the less costly it is to correct the error. This design rule certainly applies to the manufacture of an integrated circuit. When an error is found in an integrated circuit design, the process must be started over at the beginning to correct the problem. If an error is found during the early stage of electrical circuit design, there is very little time or effort needed to update the electrical circuit schematic. If a problem is found after the electrical circuit has been laid out for manufacture as an integrated circuit, the electrical circuit schematic must be corrected, and the entire integrated circuit layout process must be repeated. Similarly, if a problem is found after the circuit is manufactured, the electrical circuit must be corrected, and the integrated circuit layout and manufacturing processes must be repeated. There are a number of analysis tools that analyze an electrical circuit schematic to ensure the electrical circuit represented by the schematic operates correctly. However, there is not a good analysis tool to inspect the electrical circuit schematic to locate topological circuit problems that are associated with creating the electrical circuit as an integrated circuit.

Creating a Netlist DataBase (NDB) to store electrical circuit data representative of the electrical circuit permits a topological check to be performed on the electrical circuit prior to laying out the electrical circuit for manufacture as an integrated circuit. Writing analysis software to inspect data stored in a text file can be very difficult, but writing analysis software, using netlist database access subroutines, to inspect electrical circuit data stored in the netlist database is much easier. Analysis software can be written to perform sophisticated topological circuit problem searches of electrical circuit data stored in the netlist database. Thus, the topological circuit problem is exposed prior to integrated circuit layout, saving considerable time and labor expense in the design process for an integrated circuit.

Figure 1:
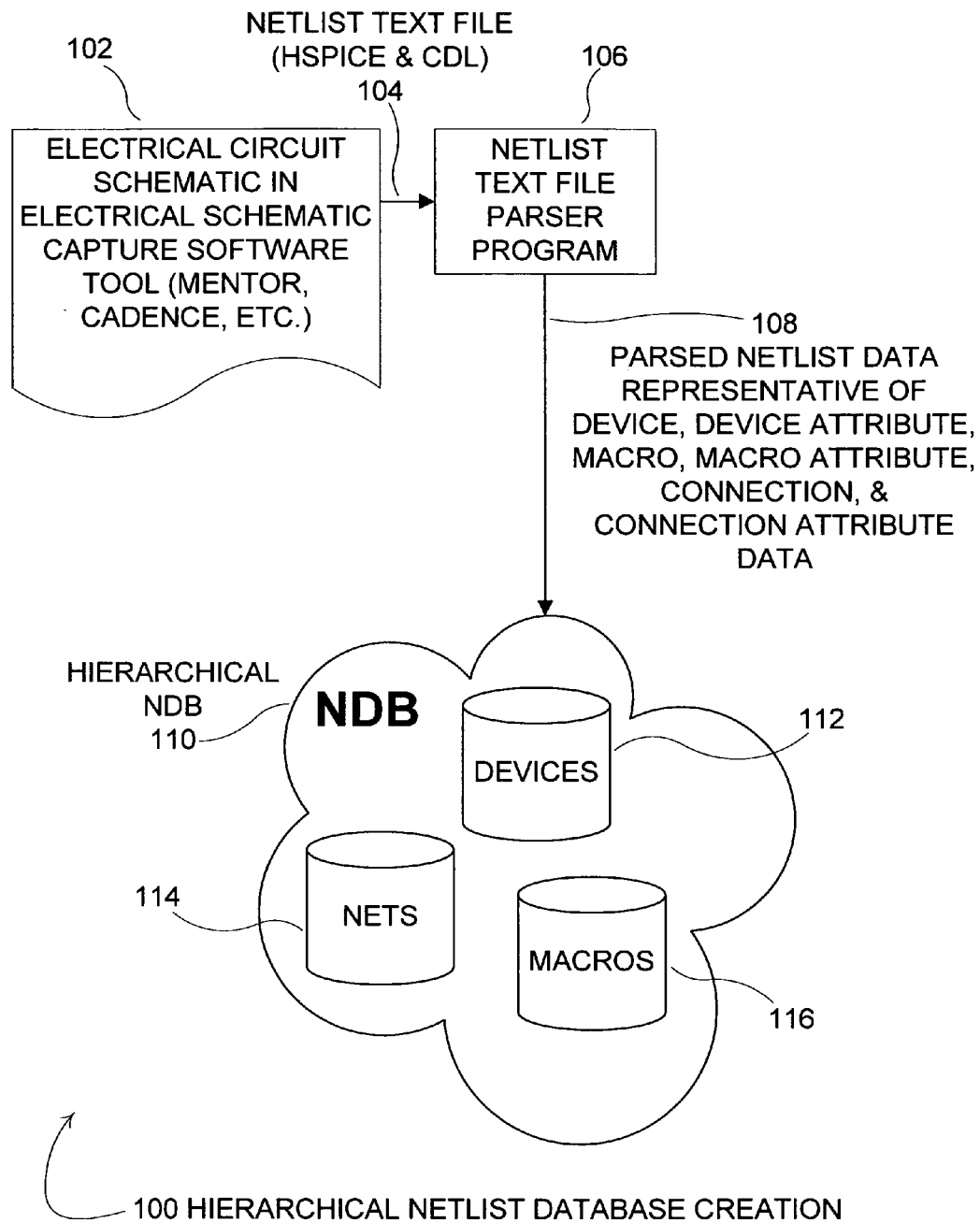
FIG. 1 is a schematic illustration of a process that creates an embodiment of a hierarchical netlist database.

FIG. 1 is a schematic illustration 100 of a process that creates an embodiment of a hierarchical netlist database 110. An electrical circuit schematic 102 that is representative of an electrical circuit is created using a commercially available electrical schematic capture software tool. The electrical schematic capture software tool is available from Mentor Graphics Corporation, Cadence Design Systems, Synopsys, Inc., and other software tool vendors. A netlist text file 104 representative of the electrical circuit schematic 102 is produced by the electrical schematic capture software tool. For the embodiment of the invention illustrated in FIG. 1, the netlist text file 104 format follows the HSPICE netlist text file format or the Circuit Design Language (CDL) netlist text file format. For a different embodiment of the invention the netlist text file 104 may be formatted in something other than HSPICE netlist format or Circuit Design Language (CDL) netlist format. The SPECTRE netlist text file format is another possible format for the netlist text file 104. The netlist text file 104 is parsed by a netlist text file parser program 106. The netlist text file parser program 106 creates a hierarchical netlist database structure 110 consisting of a devices table 112, a nets table 114, and a macros table 116. The netlist text file parser program 106 parses the netlist text file 104 to obtain parsed netlist data 108. The parsed netlist data 108 is electrical circuit data describing the electrical circuit represented by the electrical circuit schematic 102 that the netlist text file 104 is based on.

The parsed netlist data 108 consists of devices, device attributes, macros, macro attributes, connections, and connection attribute data representative of the electrical circuit schematic 102. Device data names and enumerates all primitive electrical devices contained in the electrical circuit schematic. A primitive electrical device is an electrical device that cannot be broken down into other electrical sub-devices within the electrical schematic capture software tool. A primitive electrical device is typically a basic electrical device such as a resistor, capacitor, diode, or transistor. Device attribute data contains the data used to characterize an individual electrical device, including the type of the electrical device. For instance, a resistor would have device attribute data defining the device as a resistor of one-hundred-fifty ohms resistance, a maximum power rating of fifty watts, and electrical connection points of pin one and pin two.

Macro data names and enumerates all macros contained in the electrical circuit schematic. A macro is a sub-circuit that is a grouping of primitive electrical devices and other macros. A macro might be an AND logic gate circuit or a signal amplifier circuit that an electrical circuit designer wishes to use repeatedly within a larger overall electrical circuit. Macro attribute data contains data that defines the macro including a list of all primitive electrical devices contained in the macro. Macro attribute data also contains a list of the other macros that are part of a macro. A macro cannot contain a reference to itself since that would cause a circular reference that would be difficult to resolve. Macro attribute data defines the external electrical connection points for the macro. For a macro with three external connection points, the electrical connection points might be called pin one, pin two, and pin three. Macro attribute data also defines the internal electrical connections of the primitive electrical devices and other macros contained in a macro. Primitive electrical devices contained in a macro are selected from the primitive electrical devices enumerated in the device data. Macros, excluding the macro being defined, contained in a macro are selected from the macros enumerated in the macro data. Internal electrical connections of the primitive electrical devices and other macros contained in a macro are selected from electrical connections enumerated in the connection data.

Connection data names and enumerates all electrical connections contained in the electrical circuit schematic. An electrical connection is an electrical short between two or more primitive electrical devices and/or macros. An electrical short can be thought of as a wire with zero resistance that connects to all of the primitive electrical devices and macros contained in an electrical connection. An electrical connection is sometimes called a net. Electrical connection attribute data defines which primitive electrical devices and which macros belong to an electrical connection. The connection point used by each primitive electrical device and the external connection point used by each macro contained in the electrical connection are also defined in the electrical attribute data. For example, an electrical connection might consist of a twenty ohm resistor connected at pin one of the resistor, a fifty milli-Henry inductor connected at pin two of the inductor, and a signal amplifier macro connected at input pin one of the signal amplifier macro. Primitive electrical devices contained in an electrical connection are selected from the primitive electrical devices enumerated in the device data. Macros contained in an electrical connection are selected from the macros enumerated in the macro data.

The hierarchical netlist database 110 of the embodiment illustrated in FIG. 1 is considered hierarchical because the data structure creates separate data tables for devices 112, macros 116, and nets 114 (or electrical connections). A different embodiment may condense all of the data stored in the three database tables into one or two database tables. As an object oriented database, the hierarchical netlist database 110 provides netlist database access subroutines, sometimes called methods, to permit software to programmatically access data stored in the hierarchical netlist database 110. There are separate netlist database access subroutines for each object type and each object holding table that makes up the hierarchical netlist database 110 structure. For the hierarchical netlist database 110, there would be database access routines for the devices table 112, the device object structure defining devices contained in the devices table 112, the macros table 116, the macro object structure defining devices contained in the macros table 116, the nets table 114, and the net object structure defining nets contained in the nets table 114. Reducing the number of database tables and object types might make writing a program to access the hierarchical netlist database 110 easier, since there would be fewer distinct and separate database access subroutines.

Figure 2:
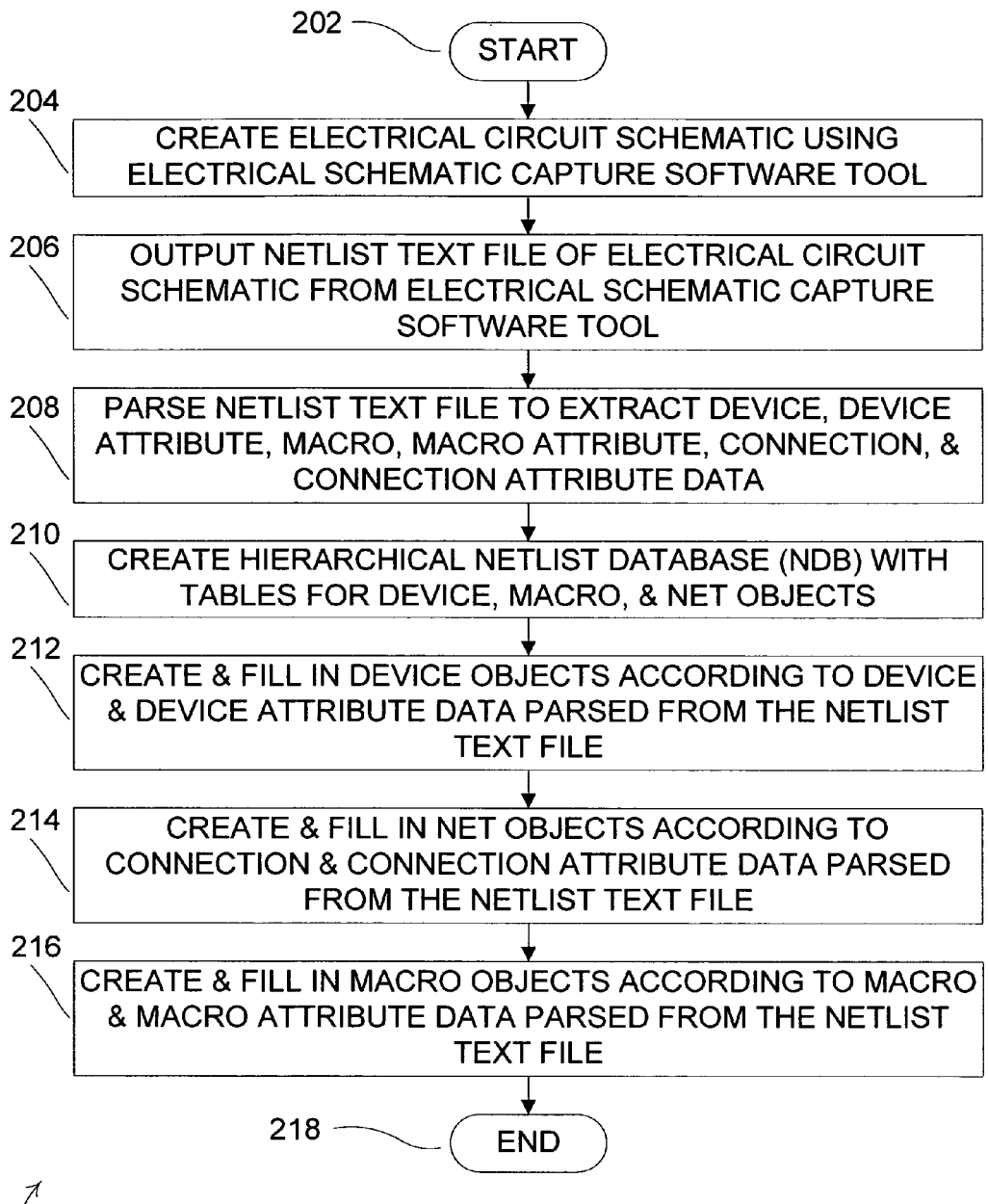
FIG. 2 is a flow chart describing the steps involved in creating the embodiment of the hierachical netlist database illustrated in FIG. 1.

FIG. 2 is a flow chart 200 describing the steps involved in creating the embodiment of the hierachical netlist database 110 illustrated in FIG. 1. The hierachical netlist database creation process starts 202 by creating an electrical circuit schematic that is representative of an electrical circuit using a commercially available electrical schematic capture software tool 204. The electrical schematic capture software tool is then commanded to export a netlist text file that is representative of the electrical circuit schematic 206. The netlist text file is then parsed to extract devices, device attributes, macros, macro attributes, connections, and connection attribute data 208. A hierarchical netlist database structure containing tables for device, macro, and net objects is then created in order to store the parsed netlist data 210. All device objects are then created and filled in according to the devices and device attribute data contained in the parsed netlist data 212. All device objects are stored in the devices table. All net objects are then created and filled in according to the connections and connection attribute data contained in the parsed netlist data 214. All net objects are stored in the nets table. All macro objects are then created and filled in according to the macros and macro attribute data contained in the parsed netlist data 216. All macro objects are stored in the macros table. Creating and filling in the macro objects occurs at the end 218 of the hierarchical netlist database creation process. The order of operation of some steps, such as parsing the netlist text file 208 and creating the empty hierachical netlist database structure 210, may be reversed. Other steps must be performed in sequence, such as creating and filling in device objects 212 must be done after parsing the netlist text file 208 and creating the hierarchical netlist database structure 210, since output from the prior steps is necessary to complete the step in question.

Figure 3:
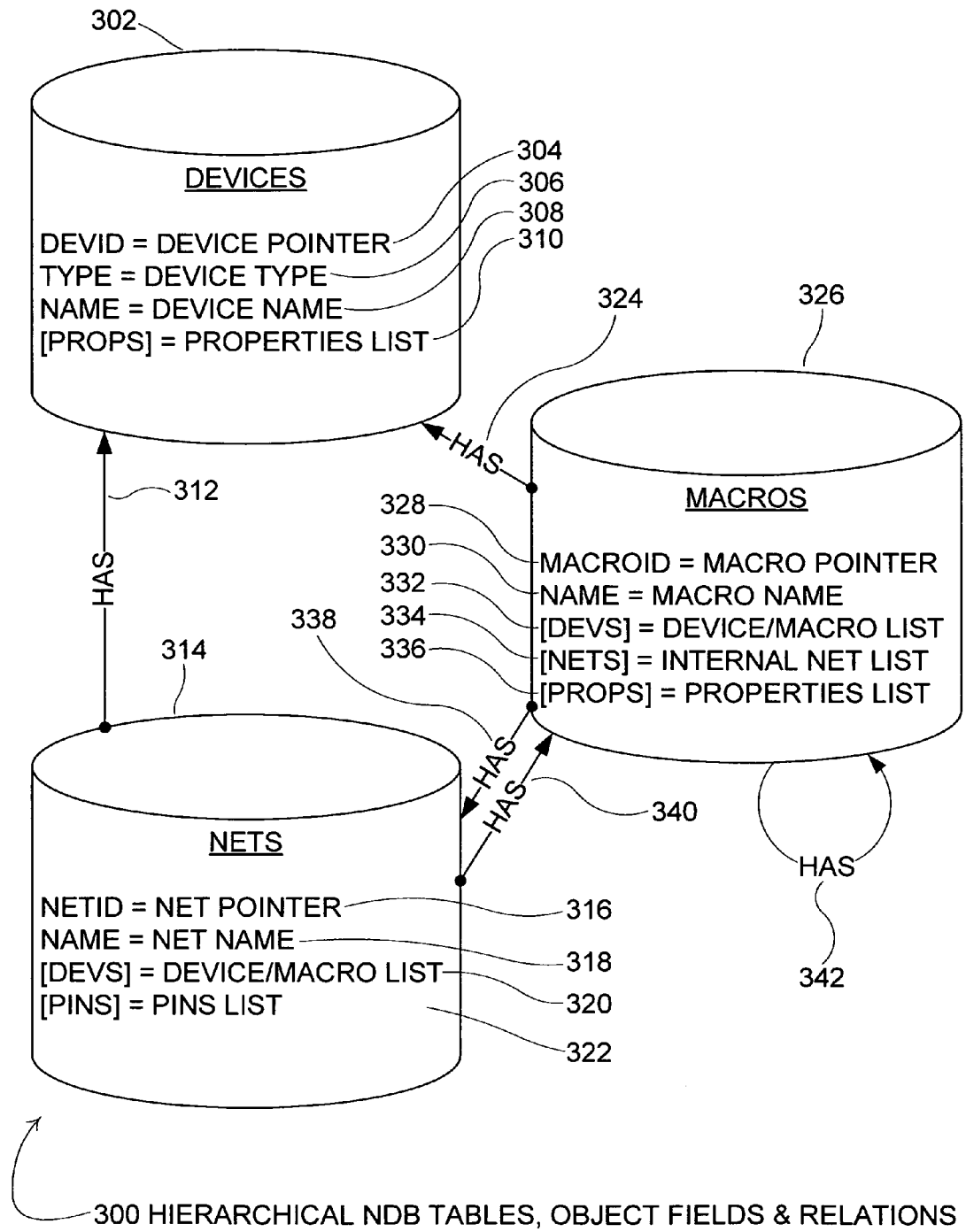
FIG. 3 is a schematic object and relationship illustration showing the data tables, object fields, and data table relationships of the embodiment of the hierarchical netlist database illustrated in FIG. 1.

FIG. 3 is a schematic object and relationship illustration 300 showing the data tables, object fields, and data table relationships of the embodiment of the hierarchical netlist database 110 illustrated in FIG. 1. The hierachical netlist database consists of three data tables, a devices table 302, a macros table, 326, and a nets table 314. Each device object stored in the devices table 302 is a database object structure that has properties defining characteristics of a primitive electrical device. An object property is also commonly called an object field for databases, or simply a data element of the object. The minimum data elements needed to define a device object includes a pointer to the device object 304 used to programmatically locate the device object, the type of the primitive electrical device 306 represented by the device object, the name of the primitive electrical device 308 represented by the device object, and a list of properties 310 that characterize the primitive electrical device represented by the device object. The list of properties 310 includes properties such as the resistance value for a resistor and the electrical connection points for any type of primitive electrical device.

Each macro object in the macros table 326 is a database object structure that has data elements defining characteristics of a macro. The minimum data elements needed to define a macro object includes a pointer to the macro object 328 used to programmatically locate the macro object, the name of the macro 330 represented by the macro object, a list of device and macro objects 332 that are part of the macro, a list of net objects 334 that are part of the macro, and a list of properties 336, such as external electrical connection points of the macro, that characterize the macro represented by the macro object. Device objects in the devices and macros list 332 for a macro object are selected from the devices table 302, hence, the macros table 326 has 324 device objects contained in the devices table 302. Macro objects in the devices and macros list 332 for a macro object are selected from the macros table 326, hence, the macros table 326 has 342 macro objects contained in the macros table 326. A macro object may not reference itself in the macro object devices and macros list 332. Net objects, defining the internal electrical connections of the macro, in the internal nets list 336 for a macro object are selected from the nets table 314, hence, the macros table 326 has 338 net objects contained in the nets table 314.

Each net object in the nets table 314 is a database object structure that has data elements defining characteristics of an electrical connection, or net. The minimum data elements needed to define a net object includes a pointer to the net object 316 used to programmatically locate the net object, the name of the net 318 represented by the net object, a list of device and macro objects 320 that are part of the net, and a list of electrical connection points, or pins 322, of each device and macro object contained in the net. It is possible that the data stored in the devices and macros list 320 and the pins list 322 may be contained in a single list defining both the devices and macros, and the electrical connection points, or pins, in one reference entry. Device objects in the devices and macros list 320 for a net object are selected from the devices table 302, hence, the nets table 314 has 312 device objects contained in the devices table 302. Macro objects in the devices and macros list 320 for a net object are selected from the macros table 326, hence, the nets table 314 has 340 macro objects contained in the macros table 326.

Figure 4:
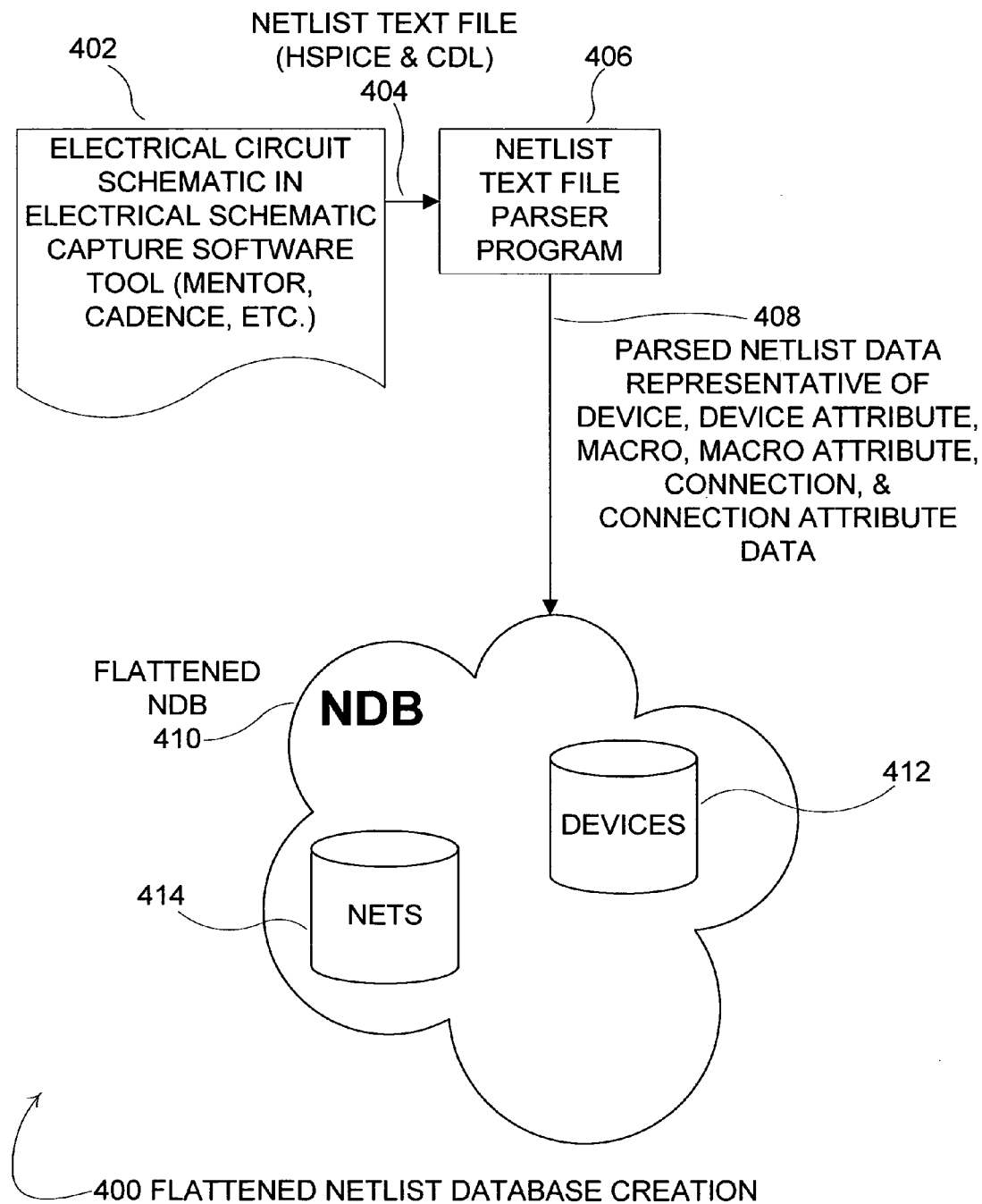
FIG. 4 is a schematic illustration of a process that creates an embodiment of a flattened netlist database.

FIG. 4 is a schematic illustration 400 of a process that creates an embodiment of a flattened netlist database 410. This is essentially the same process, with the same definitions as the process to create a hierarchical netlist database 110 disclosed in the description with respect to FIG. 1. The primary difference between the hierarchical netlist database 110 disclosed in the description with respect to FIG. 1 and the flattened netlist database 410 illustrated in FIG. 4, is that the flattened netlist database 410 does not have a separate table to store macros and macro attribute data contained in the parsed netlist data 408. The creation of the flattened netlist database 410 begins with an electrical circuit schematic 402 that is representative of an electrical circuit created using a commercially available electrical schematic capture software tool. The electrical schematic capture software tool is available from Mentor Graphics Corporation, Cadence Design Systems, Synopsys, Inc., and other software tool vendors. The netlist text file 404 representative of the electrical circuit schematic 402 is produced by the electrical schematic capture software tool. For the embodiment of the invention illustrated in FIG. 4, the netlist text file 404 format follows the HSPICE netlist text file format or the Circuit Design Language (CDL) netlist text file format. The netlist text file 404 is parsed by a netlist text file parser program 406. The netlist text file parser program 406 creates a flattened netlist database structure 410 consisting of a devices table 412 and a nets table 414. The netlist text file parser program 406 parses the netlist text file 404 to obtain parsed netlist data 408. The parsed netlist data 408 is electrical circuit data describing the electrical circuit represented by the electrical circuit schematic 402 that the netlist text file 404 is based on. The parsed netlist data 408 consists of devices, device attributes, macros, macro attributes, connections, and connection attribute data representative of the electrical circuit schematic. The parsed netlist data 408 is the same as described in the description of the hierarchical netlist database 110 disclosed in the description with respect to FIG. 1.

The flattened netlist database 410 of the embodiment illustrated in FIG. 4 is considered flattened because the data structure creates separate tables only for devices 412 and nets 414 (electrical connections). The macros and macro attribute data is incorporated into the device object and net object data structures. This configuration allows analysis software written using the netlist database access subroutines to be less complex because there are only two tables and two object types to handle, rather than three tables and three object types.

Figure 5:
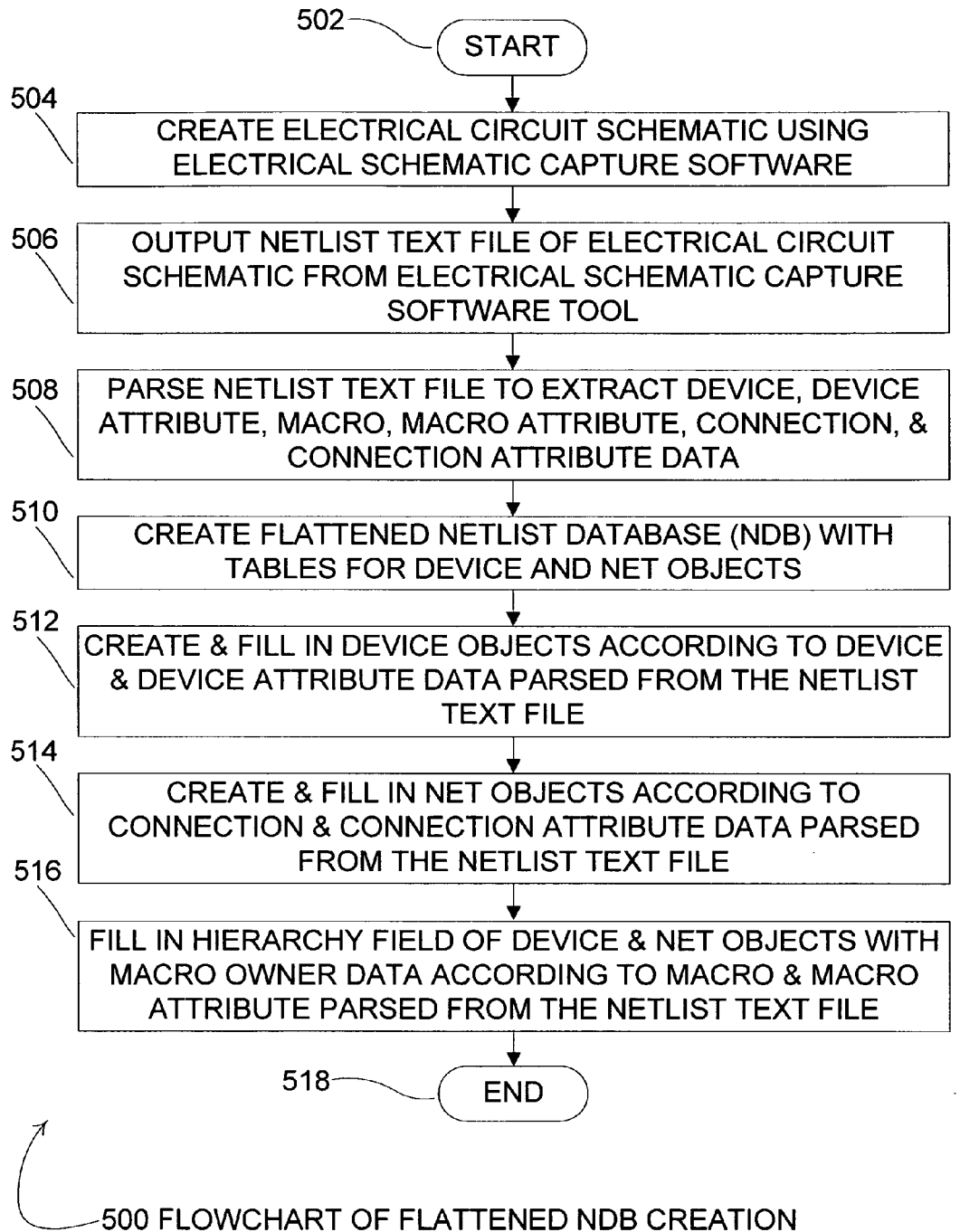
FIG. 5 is a flow chart describing the steps involved in creating the embodiment of the flattened netlist database illustrated in FIG. 4.

FIG. 5 is a flow chart 500 describing the steps involved in creating the embodiment of the flattened netlist database 410 illustrated in FIG. 4. This is essentially the same flow chart 200, with the same definitions as the flow chart 200 describing the creation of a hierarchical netlist database disclosed in the description with respect to FIG. 2. The primary difference between the hierarchical netlist database creation flow chart 200 disclosed in the description with respect to FIG. 2 and the flattened netlist database flow chart 500 illustrated in FIG. 5, is that the flattened netlist database flow chart 500 eliminates steps involving a macros object data structure or a macros table. All macros and macro attribute data is stored within device object and net object data structures. The flattened netlist database creation process starts 502 by creating an electrical circuit schematic that is representative of an electrical circuit using a commercially available electrical schematic capture software tool 504. The electrical schematic capture software tool is then commanded to export a netlist text file that is representative of the electrical circuit schematic 506. The netlist text file is then parsed to extract devices, device attributes, macros, macro attributes, connections, and connection attribute data 508. A hierarchical netlist database structure containing tables for device and net objects is then created in order to store the parsed netlist data 510. All device objects are then created and filled in according to the devices and device attribute data contained in the parsed netlist data 512. All device objects are stored in the devices table. All net objects are then created and filled in according to the connections and connection attribute data contained in the parsed netlist data 514. All net objects are stored in the nets table. Macros and macro attribute data contained in the parsed netlist data is then added to the hierarchy field of the device objects and the net objects 516. A field of an object is also called a data element or a property of the object. Filling in the hierarchy field of the device and net objects occurs at the end 518 of the flattened database creation process. The order of operation of some steps, such as parsing the netlist text file 508 and creating the empty flattened netlist database structure 510, may be reversed. Other steps must be performed in sequence, such as creating and filling in device objects 512 must be done after parsing the netlist text file 508 and creating the flattened netlist database structure 510, since output from the prior steps is necessary to complete the step in question.

Figure 6:
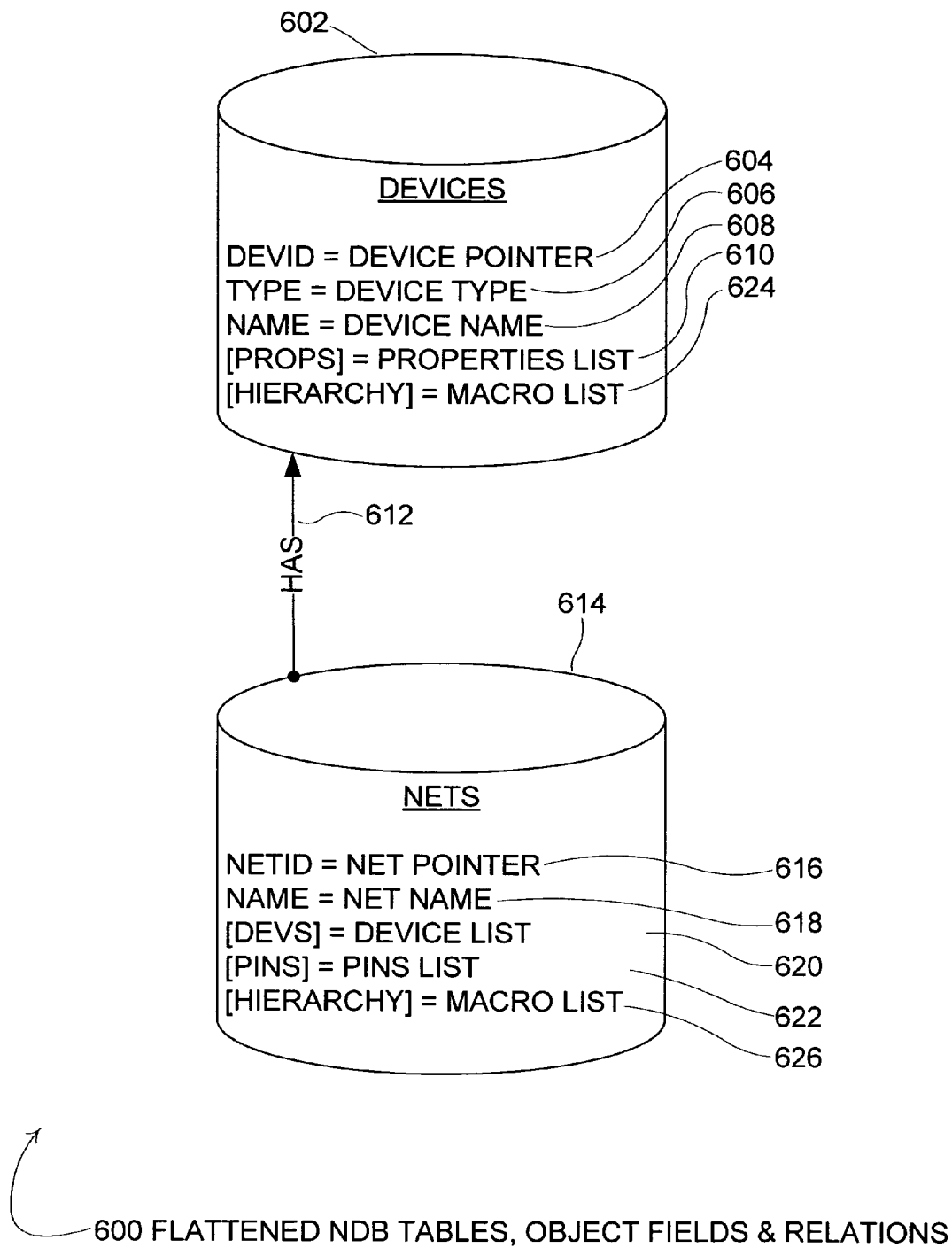
FIG. 6 is a schematic object and relationship illustration showing the data tables, object fields, and data table relationships of the embodiment of the flattened netlist database illustrated in FIG. 4.

FIG. 6 is a schematic object and relationship illustration 600 showing the data tables, object fields, and data table relationships of the embodiment of the flattened netlist database 410 illustrated in FIG. 4. This is essentially the same netlist database structure as the hierarchical netlist database structure 300 disclosed in the description with respect to FIG. 3. The primary difference between the hierarchical netlist database structure 300 disclosed in the description with respect to FIG. 3, and the flattened netlist database structure 600 illustrated in FIG. 6, is that the flattened netlist database structure 600 does not have a separate table to store macros and macro attribute data contained in the parsed netlist data. The flattened netlist database consists of two data tables, a devices table 602 and a nets table 614. Each device object stored in the devices table 602 is a database object structure that has properties defining characteristics of a primitive electrical device. The device object structure contains a hierarchy field 624 to hold the macros and macro attribute data relevant to the primitive electrical device described by the device object. In addition to the hierarchy field 624, the minimum data elements needed to define a device object includes a pointer to the device object 604 used to programmatically locate the device object, the type of the primitive electrical device 606 represented by the device object, the name of the primitive electrical device 608 represented by the device object, and a list of properties 610 that characterize the primitive electrical device represented by the device object. The list of properties 610 includes properties such as the resistance value for a resistor and the electrical connection points for any type of primitive electrical device.

Each net object in the nets table 614 is a database object structure that has data elements defining characteristics of an electrical connection, or net. The net object structure contains a hierarchy field 626 to hold the macros and macro attribute data relevant to the primitive net described by the net object. In addition to the hierarchy field 626, the minimum data elements needed to define a net object includes a pointer to the net object 616 used to programmatically locate the net object, the name of the net 618 represented by the net object, a list of device objects 620 that are part of the net, and a list of electrical connection points, or pins 622, of each device object contained in the net. It is possible that the devices list 620, and the pins list 622 may be contained in a single list defining both the device and the device electrical connection point, or pin, in one reference. Device objects in the devices list 620 for a net object are selected from the devices table 602, hence, the nets table 614 has 612 device objects contained in the devices table 602.

Figure 7:
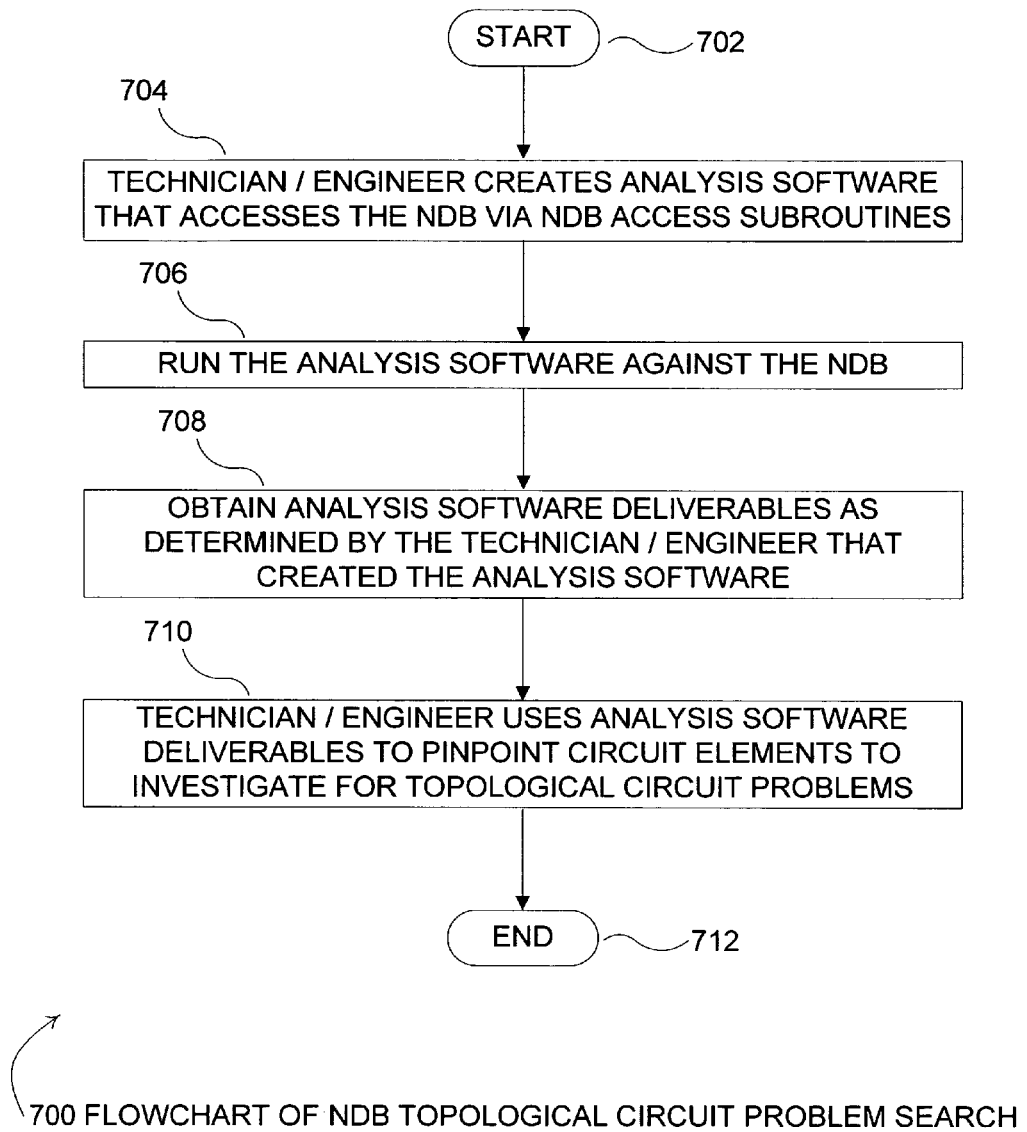
FIG. 7 is a flow chart describing the steps involved in searching an embodiment of a netlist database to find topological circuit problems in an electrical circuit described by the data stored in the netlist database.

FIG. 7 is a flow chart 700 describing the steps involved in searching an embodiment of a netlist database to find topological circuit problems in an electrical circuit described by the data stored in the netlist database. To start 702, a technician, engineer, or other qualified person creates analysis software that reads and updates the netlist database using the netlist database access subroutines that are part of the netlist database 704. The analysis software is designed to locate topological circuit problems of concern to the analysis software creator. Typically the analysis software is used to find topological circuit problems that have to do with issues encountered when an electrical circuit is laid out and manufactured as an integrated circuit. This search for a topological circuit problem is often part of a Design Rules Check (DRC) performed on an integrated circuit layout prior to integrated circuit manufacture. Here the DRC is performed before the integrated circuit is laid out, saving significant time needed to re-layout the integrated circuit if a topological circuit problem exists. After the analysis software is created 704, the analysis software is run against the netlist database 706. When the analysis software is run, deliverable outputs desired by the analysis software creator are produced 708. A technician, engineer, or other qualified person inspects the analysis software deliverables to pinpoint the problem circuit elements that might need further investigation for topological circuit problems 710. Once the analysis software deliverables have been used to pinpoint a circuit problem 710, the search of the netlist database for circuit problems is ended 712.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A computer system that is queried to determine electrical circuit characteristics of data stored in a netlist database comprising:
   a computer-readable electronic storage medium;
   a computer that reads and writes data from and to said electronic storage medium;
   parsed netlist data that has been parsed from a netlist text file that is representative of an electrical circuit, said netlist text file being created by an electrical schematic capture software tool, said electrical schematic capture software tool deriving said netlist text file from an electrical circuit schematic representative of said electrical circuit, and said parsed netlist data being representative of device data, device attribute data, macro data, macro attribute data, connection data, and connection attribute data of said electrical circuit;
   an object oriented database structure that stores said parsed netlist data on said electronic storage medium comprising objects and object holding tables logically organized to represent said device data, said device attribute data, said macro data, said macro attribute data, said connection data, and said connection attribute data contained in said parsed netlist data; and
   netlist database access subroutines that permit an external software program to read and update said parsed netlist data contained in said netlist database in order to programmatically analyze said electrical circuit characteristics to locate topological circuit problems.

2. The computer system of claim 1 wherein said netlist text file is written following netlist text file format as defined for use with electrical schematic capture software identified by HSPICE trademark.

3. The computer system of claim 1 wherein said netlist text file is written following the Circuit Design Language netlist text file format.

4. The computer system of claim 1 wherein said device data is representative of the number of primitive electrical devices and the names of each of said primitive electrical devices contained in said parsed netlist data, where said primitive electrical devices are electrical devices that cannot be broken down into any sub-devices within said electrical schematic capture software tool.

5. The computer system of claim 1 wherein said device attribute data is representative of electrical connection points, electrical device type, and additional electrical characteristics of each device enumerated in said device data.

6. The computer system of claim 1 wherein said macro data is representative of the number of macros and the names of each of said macros contained in said parsed netlist database, wherein a macro is a named combination of primitive electrical devices and other macros, and electrical connections of said primitive electrical devices and said other macros.

7. The computer system of claim 1 wherein said macro attribute data is representative of names of primitive electrical devices, names of other macros, names of connections of said primitive electrical devices and said other macros, and external electrical connection points of each macro enumerated in said macro data, where said names of primitive electrical devices are selected from said device data, said names of other macros are selected from said macro data, and said names of connections are selected from said connection data.

8. The computer system of claim 1 wherein said connection data is representative of the number of electrical connections and the names of each of said electrical connections that are contained in said parsed netlist data.

9. The computer system of claim 1 wherein said connection attribute data is representative of names of primitive electrical devices, names of macros, and electrical connection points of said primitive electrical devices and said macros of each connection enumerated in said connection data, where said names of primitive electrical devices are selected from said device data and said names of macros are selected from said macro data.

10. The computer system of claim 1 wherein said object oriented database structure further comprises:
   a device object data structure that stores a device name and said device attribute data for a primitive electrical device;
   a devices table that stores device objects that are instances of said device object data structure such that there is a device object instance for each device enumerated in said device data, each said device object instance containing said device attribute data of each of said devices enumerated in said device data;
   a macro object data structure that stores a macro name and said macro attribute data for a macro;
   a macros table that stores macro objects that are instances of said macro object data structure such that there is a macro object instance for each macro enumerated in said macro data, each said macro object instance containing said macro attribute data of each of said macros enumerated in said macro data;
   a net object data structure that stores a connection name and said connection attribute data for an electrical connection;
   a nets table that stores net objects that are instances of said net object data structure such that there is a net object instance for each connection enumerated in said connection data, each said net object instance containing said connection attribute data of each of said connections enumerated in said connection data;
   table access subroutines that permit said external software program to retrieve and update data stored in said devices table, said macros table, and said nets table; and
   object access subroutines that permit said external software program to retrieve and update data stored in said device object data structure, said macro object data structure, and said net object data structure, and where said table access subroutines and said object access subroutines combine to make up said netlist database access subroutines.

11. The computer system of claim 10, wherein said macro object data structure further comprises:
   an apparatus object pointers list that stores apparatus object pointers that are instances of a pointer to an apparatus object such that there is an apparatus object pointer instance for each apparatus object named in said macro attribute data; and
   an internal macro net object pointers list that stores internal macro net object pointers that are instances of a pointer to an internal macro net object such that there is an internal macro net object pointer for each connection named in said macro attribute data.

12. The computer system of claim 11 wherein said apparatus objects comprise at least one of the group comprising: an instance of said device object data structure, and an instance of said macro object data structure.

13. The computer system of claim 10, wherein said net object data structure further comprises an apparatus object pointers list that stores apparatus object pointers that are instances of a pointer to an apparatus object such that there is an apparatus object pointer instance for each apparatus object named in said connection attribute data.

14. The computer system of claim 13 wherein said apparatus objects comprise at least one of the group comprising: an instance of said device object data structure, and an instance of said macro object data structure.

15. The computer system of claim 1 wherein said object oriented database structure further comprises:
   a device object data structure that stores a device name and said device attribute data for a primitive electrical device, said device object data structure further being capable of storing a hierarchy of macro names, said hierarchy of macro names being an ordered list of all macros possessing said primitive electrical device;
   a devices table that stores device objects that are instances of said device object data structure such that there is a device object instance for each device enumerated in said device data, each said device object instance containing said device attribute data of each of said devices enumerated in said device data, and each said device object instance further containing said hierarchy of macro names enumerating macros possessing each of said devices, each of said macros being enumerated in said macro data and each of said devices possessed by each of said macros being enumerated in said macro attribute data;
   a net object data structure that stores a connection name and said connection attribute data for an electrical connection, said net object data structure further storing a hierarchy of macro names, said hierarchy of macro names being an ordered list of all macros possessing said electrical connection;
   a nets table that stores net objects that are instances of said net object data structure such that there is a net object instance for each connection enumerated in said connection data, each said net object instance containing said connection attribute data of each of said connections enumerated in said connection data, and each said net object instance further containing said hierarchy of macro names enumerating macros possessing each of said connections, each of said macros being enumerated in said macro data and each of said connections possessed by each of said macros being enumerated in said macro attribute data;
   table access subroutines that permit said external software program to retrieve and update data stored in said devices table and said nets table; and
   object access subroutines that permit said external software program to retrieve and update data stored in said device object data structure and said net object data structure, and where said table access subroutines and said object access subroutines combine to make up said netlist database access subroutines.

16. The computer system of claim 15, wherein said net object data structure further comprises a device object pointers list that stores device object pointers that are instances of a pointer to a device object such that there is a device object pointer instance for each device object named in said connection attribute data.

17. A netlist text file parsing computer system that creates and fills in a netlist database comprising:
   a computer-readable electronic storage medium for storing said netlist database;
   a computer that reads and writes data from and to said electronic storage medium;

a parsing process that parses a netlist text file to obtain parsed netlist data, said parsed netlist data being representative of device data, device attribute data, macro data, macro attribute data, connection data, and connection attribute data of said electrical circuit;

an input for accepting a netlist text file for processing by said parsing process, said netlist text file being representative of an electrical circuit, and said netlist text file being created by an electrical schematic capture software tool, said electrical schematic capture software tool deriving said netlist text file from an electrical circuit schematic representing said electrical circuit; and a netlist database creation process that creates a netlist database, said netlist database being stored on said electronic storage medium, said netlist database further allowing an external software program to read and update said netlist database in order to programmatically analyze said electrical circuit to locate topological circuit problems, said netlist database comprising:

an object oriented database structure that stores said parsed netlist data comprising objects and object holding tables logically organized to represent said device data, said device attribute data, said macro data, said macro attribute data, said connection data, and said connection attribute data contained in said parsed netlist data; and netlist database access subroutines that permit said external software program to read and update said parsed netlist data contained in said netlist database; and a netlist database loading process that creates object instances and places said object instances into said object holding tables so as to represent said electrical circuit as said electrical circuit is described by said parsed netlist data.

18. The netlist text file parsing computer system of claim 17 wherein said netlist text file is written following netlist text file format as defined for use with electrical schematic capture software identified by HSPICE trademark.

19. The netlist text file parsing computer system of claim 17 wherein said netlist text file is written following the Circuit Design Language netlist text file format.

20. The netlist text file parsing computer system of claim 17 wherein said device data is representative of the number of primitive electrical devices and the names of each of said primitive electrical devices that are contained in said parsed netlist data, said primitive electrical devices being electrical devices that cannot be broken down into any sub-devices within said electrical schematic capture software tool.

21. The netlist text file parsing computer system of claim 17 wherein said device attribute data is representative of electrical connection points, electrical device type, and additional electrical characteristics of each device enumerated in said device data.

22. The netlist text file parsing computer system of claim 17 wherein said macro data is representative of the number of macros and the names of each of said macros contained in said parsed netlist database, wherein a macro is a named combination of primitive electrical devices and other macros, and electrical connections of said primitive electrical devices and said other macros.

23. The netlist text file parsing computer system of claim 17 wherein said macro attribute data is representative of names of primitive electrical devices, names of other macros, names of connections of said primitive electrical devices and said other macros, and external electrical connection points of each macro enumerated in said macro data, where said names of primitive electrical devices are selected from said device data, said names of other macros are selected from said macro data, and said names of connections are selected from said connection data.

24. The netlist text file parsing computer system of claim 17 wherein said connection data is representative of the number of electrical connections and the names of each of said electrical connections that are contained in said parsed netlist data.

25. The netlist text file parsing computer system of claim 17 wherein said connection attribute data is representative of names of primitive electrical devices, names of macros, and electrical connection points of said primitive electrical devices and said macros of each connection enumerated in said connection data, where said names of primitive electrical devices are selected from said device data and said names of macros are selected from said macro data.

26. The netlist text file parsing computer system of claim 17 wherein said object oriented database structure further comprises:

a device object data structure that stores a device name and said device attribute data for a primitive electrical device;

a devices table that stores device objects that are instances of said device object data structure such that there is a device object instance for each device enumerated in said device data, each said device object instance containing said device attribute data of each of said devices enumerated in said device data;

a macro object data structure that stores a macro name and said macro attribute data for a macro;

a macros table that stores macro objects that are instances of said macro object data structure such that there is a macro object instance for each macro enumerated in said macro data, each said macro object instance containing said macro attribute data of each of said macros enumerated in said macro data;

a net object data structure that stores a connection name and said connection attribute data for an electrical connection;

a nets table that stores net objects that are instances of said net object data structure such that there is a net object instance for each connection enumerated in said connection data, each said net object instance containing said connection attribute data of each of said connections enumerated in said connection data;

table access subroutines that permit said external software program to retrieve and update data stored in said devices table, said macros table, and said nets table; and object access subroutines that permit said external software program to retrieve and update data stored in said device object data structure, said macro object data structure, and said net object data structure, and where said table access subroutines and said object access subroutines combine to make up said netlist database access subroutines.

27. The netlist text file parsing computer system of claim 26, wherein said macro object data structure further comprises:

an apparatus object pointers list that stores apparatus object pointers that are instances of a pointer to an apparatus object such that there is an apparatus object pointer instance for each apparatus object named in said macro attribute data; and an internal macro net object pointers list that stores internal macro net object pointers that are instances of a pointer to an internal macro net object such that there is an internal macro net object pointer for each connection named in said macro attribute data.

28. The netlist text file parsing computer system of claim 27 wherein said apparatus objects comprise at least one of the group comprising: an instance of said device object data structure, and an instance of said macro object data structure.

29. The netlist text file parsing computer system of claim 26, wherein said net object data structure further comprises an apparatus object pointers list that stores apparatus object pointers that are instances of a pointer to an apparatus object such that there is an apparatus object pointer instance for each apparatus object named in said connection attribute data.

30. The netlist text file parsing computer system of claim 29 wherein said apparatus objects comprise at least one of the group comprising: an instance of said device object data structure, and an instance of said macro object data structure.

31. The netlist text file parsing computer system of claim 17 wherein said object oriented database structure further comprises:
 a device object data structure that stores a device name and said device attribute data for a primitive electrical device, said device object data structure further storing a hierarchy of macro names, said hierarchy of macro names being an ordered list of all macros possessing said primitive electrical device;
 a devices table that stores device objects that are instances of said device object data structure such that there is a device object instance for each device enumerated in said device data, each said device object instance containing said device attribute data of each of said devices enumerated in said device data, and each said device object instance further containing said hierarchy of macro names enumerating macros possessing each of said devices, each of said macros being enumerated in said macro data and each of said devices possessed by each of said macros being enumerated in said macro attribute data;
 a net object data structure that stores a connection name and said connection attribute data for an electrical connection, said net object data structure further being capable of storing a hierarchy of macro names, said hierarchy of macro names being an ordered list of all macros possessing said electrical connection;
 a nets table that stores net objects that are instances of said net object data structure such that there is a net object instance for each connection enumerated in said connection data, each said net object instance containing said connection attribute data of each of said connections enumerated in said connection data, and each said net object instance further containing said hierarchy of macro names enumerating macros possessing each of said connections, each of said macros being enumerated in said macro data and each of said connections possessed by each of said macros being enumerated in said macro attribute data;
 table access subroutines that permit said external software program to retrieve and update data stored in said devices table and said nets table; and
 object access subroutines that permit said external software program to retrieve and update data stored in said device object data structure and said net object data structure, and where said table access subroutines and said object access subroutines combine to make up said netlist database access subroutines.

32. The netlist text file parsing computer system of claim 31, wherein said net object data structure further comprises a device object pointers list that stores device object pointers that are instances of a pointer to a device object such that there is a device object pointer instance for each device object named in said connection attribute data.

33. A method of creating a computer system that stores a netlist database on a computer-readable storage medium comprising the steps of:
 designing an electrical circuit by creating an electrical circuit schematic that is representative of said electrical circuit, said electrical circuit schematic being created with an electrical schematic capture software tool;
 creating a netlist text file representation of said electrical circuit by exporting said netlist text file from said electrical schematic capture software tool;
 parsing said netlist text file extracting parsed netlist data, said parsed netlist data being representative of device data, device attribute data, macro data, macro attribute data, connection data, and connection attribute data of said electrical circuit;
 creating a netlist database, said netlist database comprising:
  an object oriented database structure for storing said parsed netlist data comprising objects and object holding tables logically organized to represent said device data, said device attribute data, said macro data, said macro attribute data, said connection data, and said connection attribute data contained in said parsed netlist data; and
  netlist database access subroutines that permit an external software program to read and update said parsed netlist data contained in said netlist database;
 placing said parsed netlist data into said netlist database so as to represent said electrical circuit as said electrical circuit is described by said parsed netlist data;
 storing said netlist database on said computer-readable storage medium of said computer system; and
 creating external analysis software that reads and updates data in said netlist database using said netlist database access subroutines, said analysis software being designed so as to locate topological circuit problems, said topological circuit problems being parasitic problems associated with physical layout of said electrical circuit when said electrical circuit is manufactured as an integrated circuit.

34. The method of claim 33 wherein said netlist text file is written following netlist text file format as defined for use with electrical schematic capture software identified by HSPICE trademark.

35. The method of claim 33 wherein said netlist text file is written following the Circuit Design Language netlist text file format.

36. The method of claim 33 wherein said device data is representative of the number of primitive electrical devices and the names of each of said primitive electrical devices that are contained in said parsed netlist data, said primitive electrical devices being electrical devices that cannot be broken down into any sub-devices within said electrical schematic capture software.

37. The method of claim 33 wherein said device attribute data is representative of electrical connection points, electrical device type, and additional electrical characteristics of each device enumerated in said device data.

38. The method of claim 33 wherein said macro data is representative of the number of macros and the names of each of said macros contained in said parsed netlist database, wherein a macro is a named combination of primitive electrical devices and other macros, and electrical connections of said primitive electrical devices and said other macros.

39. The method of claim 33 wherein said macro attribute data is representative of names of primitive electrical devices, names of other macros, names of connections of said primitive electrical devices and said other macros, and external electrical connection points of each macro enumerated in said macro data, where said names of primitive electrical devices are selected from said device data, said names of other macros are selected from said macro data, and said names of connections are selected from said connection data.

40. The method of claim 33 wherein said connection data is representative of the number of electrical connections and the names of each of said electrical connections that are contained in said parsed netlist data.

41. The method of claim 33 wherein said connection attribute data is representative of names of primitive electrical devices, names of macros, and electrical connection points of said primitive electrical devices and said macros of each connection enumerated in said connection data, where said names of primitive electrical devices are selected from said device data and said names of macros are selected from said macro data.

42. The method of claim 33 wherein said object oriented database structure further comprises:

a device object data structure that stores a device name and said device attribute data for a primitive electrical device;

a devices table that stores device objects that are instances of said device object data structure such that there is a device object instance for each device enumerated in said device data, each said device object instance containing said device attribute data of each of said devices enumerated in said device data;

a macro object data structure that stores a macro name and said macro attribute data for a macro;

a macros table that stores macro objects that are instances of said macro object data structure such that there is a macro object instance for each macro enumerated in said macro data, each said macro object instance containing said macro attribute data of each of said macros enumerated in said macro data;

a net object data structure that stores a connection name and said connection attribute data for an electrical connection;

a nets table that stores net objects that are instances of said net object data structure such that there is a net object instance for each connection enumerated in said connection data, each said net object instance containing said connection attribute data of each of said connections enumerated in said connection data;

table access subroutines that permit said external software program to retrieve and update data stored in said devices table, said macros table, and said nets table; and object access subroutines that permit said external software program to retrieve and update data stored in said device object data structure, said macro object data structure, and said net object data structure, and where said table access subroutines and said object access subroutines combine to make up said netlist database access subroutines.

43. The method of claim 42, wherein said macro object data structure further comprises:

an apparatus object pointers list that stores apparatus object pointers that are instances of a pointer to an apparatus object such that there is an apparatus object pointer instance for each apparatus object named in said macro attribute data; and an internal macro net object pointers list that stores internal macro net object pointers that are instances of a pointer to an internal macro net object such that there is an internal macro net object pointer for each connection named in said macro attribute data.

44. The method of claim 43 wherein said apparatus objects comprise at least one of the group comprising: an instance of said device object data structure, and an instance of said macro object data structure.

45. The method of claim 42, wherein said net object data structure further comprises an apparatus object pointers list that stores apparatus object pointers that are instances of a pointer to an apparatus object such that there is an apparatus object pointer instance for each apparatus object named in said connection attribute data.

46. The method of claim 45 wherein said apparatus objects comprise at least one of the group comprising: an instance of said device object data structure, and an instance of said macro object data structure.

47. The netlist text file parser program of claim 33 wherein said object oriented database structure further comprises:

a device object data structure that stores a device name and said device attribute data for a primitive electrical device, said device object data structure further being capable of storing a hierarchy of macro names, said hierarchy of macro names being an ordered list of all macros possessing said primitive electrical device;

a devices table that stores device objects that are instances of said device object data structure such that there is a device object instance for each device enumerated in said device data, each said device object instance containing said device attribute data of each of said devices enumerated in said device data, and each said device object instance further containing said hierarchy of macro names enumerating macros possessing each of said devices, each of said macros being enumerated in said macro data and each of said devices possessed by each of said macros being enumerated in said macro attribute data;

a net object data structure that stores a connection name and said connection attribute data for an electrical connection, said net object data structure further storing a hierarchy of macro names, said hierarchy of macro names being an ordered list of all macros possessing said electrical connection;

a nets table that stores net objects that are instances of said net object data structure such that there is a net object instance for each connection enumerated in said connection data, each said net object instance containing said connection attribute data of each of said connections enumerated in said connection data, and each said net object instance further containing said hierarchy of macro names enumerating macros possessing each of said connections, each of said macros being enumerated in said macro data and each of said connections possessed by each of said macros being enumerated in said macro attribute data;

table access subroutines that permit said external software program to retrieve and update data stored in said devices table and said nets table; and object access subroutines that permit said external software program to retrieve and update data stored in said device object data structure and said net object data structure, and where said table access subroutines and said object access subroutines combine to make up said netlist database access subroutines.

48. The netlist text file parser program of claim 47, wherein said net object data structure further comprises a device object pointers list that stores device object pointers that are instances of a pointer to a device object such that there is a device object pointer instance for each device object named in said connection attribute data.

49. The method of claim 33 further comprising the steps of:

running said analysis software in combination with said netlist database to create a circuit analysis report;

inspecting said circuit analysis report to locate said topological circuit problems; and making corrections to said electrical circuit schematic if said topological circuit problems exist.

50. The method of claim 49 wherein said analysis software is run in combination with said netlist database before said electrical circuit is laid out in an integrated circuit layout software tool.

* * * * *